United States Patent [19]

Safari et al.

[11] Patent Number: 5,539,965

[45] Date of Patent: Jul. 30, 1996

[54] METHOD FOR MAKING PIEZOELECTRIC COMPOSITES

[75] Inventors: Ahmad Safari, Princeton Junction; Victor F. Janas, Monroe Township, both of N.J.

[73] Assignee: Rutgers, The University of New Jersey, Piscataway, N.J.

[21] Appl. No.: 263,564

[22] Filed: Jun. 22, 1994

[51] Int. Cl.$^6$ ................................................ H01L 41/22
[52] U.S. Cl. ........................ 29/25.35; 310/334; 310/357; 310/358
[58] Field of Search ...................... 29/25.35; 310/334, 310/357, 358

[56] References Cited

U.S. PATENT DOCUMENTS

| | | |
|---|---|---|
| 3,590,287 | 6/1971 | Berlincourt et al. . |
| 4,412,148 | 10/1983 | Klicker et al. . |
| 4,518,889 | 5/1985 | Hoen . |
| 4,523,471 | 6/1985 | Lee . |
| 4,564,980 | 1/1986 | Diepers . |
| 4,572,981 | 2/1986 | Zola . |
| 4,658,176 | 4/1987 | Nakaya et al. . |
| 5,175,709 | 12/1992 | Slayton et al. . |
| 5,239,736 | 8/1993 | Sliwa et al. . |
| 5,246,610 | 9/1993 | Banno et al. . |

OTHER PUBLICATIONS

Composite Piezoelectric Transducers; R. E. Newnham et al, Materials in Engineering, vol. 2, Dec. 1980, pp. 93–106.
Piezoelectric Ceramic–Polymer Composites For Transducer Applications, T. R. Gururaja et al, Electronic Ceramics, 1987, pp. 92–145.
PZT–Epoxy Piezoelectric Transducers; H. P. Savakus et al; Materials Research Bulletin, vol. 16, 1981, pp. 677–680.

*Primary Examiner*—Carl E. Hall
*Attorney, Agent, or Firm*—John F. Ritter

[57] ABSTRACT

A process for forming piezoelectric composites allows for novel composite designs, including composites with different polarizable material regions and composites with a gradient in volume fraction of polarizable material. Composites with fine-scale microstructures may be formed. The new forming method is an improvement to the traditional "dice and fill" technique currently being utilized to form piezoelectric composites.

12 Claims, 2 Drawing Sheets

METHOD FOR MAKING PIEZOELECTRIC COMPOSITES

This invention was made with Government support under the Office of Naval Research, Grant No. N00014-91-J-1828, and as such the Government has certain rights to this invention.

TECHNICAL FIELD

This invention relates to a method for fabricating piezoelectric composites and unique composites so fabricated. More particularly, it provides an improved and more efficient method for fabricating composite ultrasound transducers which are useful in medical imaging, hydrophone, non-destructive evaluation, and actuator applications.

BACKGROUND OF THE INVENTION

Transducers, such as those employed in the medical ultrasound imaging industry, typically employ piezoelectric ceramic materials such as lead-zirconate-titanate (PZT) to both emit and receive ultrasound waves. For various reasons, including enhanced formability and acoustical performance, it can be advantageous to use a piezoelectric composite rather than a monolithic block of PZT.

Composite piezoelectric transducers, and methods for their production, are described, for example, in *Composite Piezoelectric Transducers;* R. E. Newnham et al; *Materials in Engineering,* Vol. 2, December 1980, pages 93–106, which is incorporated herein by reference.

Piezoelectric composites typically consist of an polarizable phase embedded in a non-polarizable material. These composites have many advantages over traditional monolithic piezoelectric ceramics including: (i) lower densities resulting in acoustic impedances closer to those of the human body, water, etc., eliminating the need for an acoustic matching layer, (ii) low dielectric constants, resulting in high piezoelectric voltage constant g, and (iii) ease of conformability to the shape of the backing material of the composite.

Two composite designs that have been particularly successful are composites with 2—2 and 1–3 connectivity, in which piezoelectric ceramic sheets or rods are aligned in the poling direction of the composite (in a matrix of a suitable polymer.) In the case of the 2—2 composite, both the ceramic and polymer phases are two-dimensionally connected throughout the composite. The stiff ceramic phase supports most of the stress applied in the direction of its alignment, yielding a high piezoelectric charge coefficient d, while the composite has a low density and dielectric constant.

In the 1–3 composite, the ceramic phase is one-dimensionally connected through the composite, while the polymer phase is three-dimensionally connected. The 1–3 composite yields superior properties to those described above for the 2—2 composite due to the lower density and lower dielectric constant.

A common and convenient method for making 2—2 and 1–3 composites is to start by cutting parallel slots into a monolithic piezoelectric ceramic block. The slots are then filled with a polymer. Typically the polymer used is non-polarizable. If one set of parallel slots are cut, the resulting composite has a 2—2 connectivity. If a second set of parallel slots are cut orthogonally to the first set of slots and backfilled with a filler material, the resulting composite has a 1–3 connectivity. Composite fabrication is completed by grinding the unslotted section of the monolithic ceramic away from the slotted section lapping the two sides parallel to one another, and electroding the surfaces containing exposed ceramic. The resulting structure essentially comprises a semiflexible mat consisting of strips, posts or rods of piezoelectric material laterally encased by polymeric matrix material such as epoxy.

A strong electric field is then applied to the composite in a direction perpendicular to the plane of the sheet using conventional poling or corona discharge techniques. The intensity of the electric field used will ordinarily be selected to provide efficient polarization. However, it will be kept below the range at which substantial dielectric breakdown of the material being polarized occurs. The aforementioned method is known as the "dice and fill" method and is described in *PZT-Epoxy Piezoelectric Transducers: A Simplified Fabrication Procedures,* H. P. Savakus et al; *Materials Research Bulletin,* Vol. 16, 1981, pages 677–680, which is incorporated herein by reference.

Although, as mentioned above, piezoelectric composites typically consist of a polarizable phase embedded in an non-polarizable phase, there is a need to development efficient methods for the manufacture of composites having multiple polarizable and/or non-polarizable phases. Finally, there is a need to develop more efficient methods for the manufacture of piezoelectric composites having decreased size and periodicity of the polarizable phase or phases. Composites having these properties have been identified as a key area of transducer development.

Some examples of these needs are evidenced in the field of medical imaging. The resolution of imaging systems can be enhanced by increasing the frequency of the generated sound wave. To increase the frequency of the sound wave, the size and periodicity of the polarizable ceramic phase in the composite must be decreased. In addition, enhanced pulse-echo properties are realized if the transducer contains transmitting and receiving sections wherein the transmitting sections contain an polarizable phase with high transmitting sensitivity, while the receiving sections contain an polarizable phase with high receiving sensitivity.

Moreover, there has been a drive to create so-called "smart" materials. Smart materials are described in *"Smart Ceramics";* Newnham et al., Ferroelectrics, Vol. 102, pp. 259–266 which is incorporated herein by reference. A smart material senses a change in the environment, and using a feedback system, makes a useful response. It is both a sensor and an actuator. A very smart material can tune its sensor and actuator functions in time and space to optimize behavior. Tuning of a very smart material can be accomplished by using a multitude of polarizable phases.

Finally, it would be desirable to have an efficient method to tailor the piezoelectric properties within a single transducer by varying the ceramic volume content across the device. This reduces the out of plane distortions of the transmitted signal.

The "dice and fill" method has several limitations in meeting the above stated needs. Dicing technology utilizes thin, diamond coated blades rotating at high speeds. The blades, often thinner than 200 microns, are expensive, difficult to handle, and have short usage lives. Moreover, the "dice and fill" technique uses monolithic ceramics, ruling out the possibility of composites with multiple polarizable ceramic phases. Finally, varying the ceramic volume content across the transducer would require frequent changes of dicing blade to vary the thickness of the slots, substantially adding to the time it takes to produce a transducer.

Alternatives to the "dice and fill" technique have attempted to address one or more of the above issues. Diepers (U.S. Pat. No. 4,564,980) and Zola (U.S. Pat. No. 4,572,981) teach the formation of fine 1–3 composites by bonding alternating layers of active and passive materials to form a laminated block. The laminated block is sliced to yield composites with 2—2 connectivity. The 2—2 composites are then bonded with a passive material to yield 1–3 composites. The present invention is advantageous over both Zola and Diepers in that there is no need to restack the composite to form 1–3 connectivity. This results in a process with much greater efficiency than both Zola and Diepers.

'T Hoen (U.S. Pat. No. 4,518,889) teaches the formation of a 1–3 composite with a varying ceramic volume content across it. Ceramic rods were aligned parallel a polymer matrix using positioning plates with a plurality of holes. The density of holes in the plate was a function of radial plate location so that there were more rods near the center of the plate than near the edges. This technique is severely limited by the time consuming and inefficient process of placing the rods in the positioning plates. Moreover, as the diameter of the rods decreases below 50 microns, composite manufacturing becomes impractical. The present invention is thus a more efficient and practical method for the manufacture of volume gradient piezoelectric composites.

SUMMARY OF THE INVENTION

The object of this invention is to provide a better method for fabricating fine size and periodicity composites for use in transducer applications.

Another object is to provide an improved methodology for forming acoustic devices with a multitude of functions. This is accomplished by using sheets or tapes of different polarizable materials in creating the composite. The transducer may, therefore, be multifunctional, and designed with regions of transmission, reception, sensing, actuation, etc. The method allows for an unlimited number of polarizable phases arranged on as fine a scale as layer by layer.

Yet another object is to provide an improved methodology for forming composites with a varying ceramic volume content across the structure. This is accomplished by changing either the spacing between, or the thickness of, the sheets or tapes in the composite. The result is the ability to tailor the piezoelectric properties within a single transducer reducing the out of plane distortions of the transmitted signal.

A novel feature of this invention is to stack sheets or tapes (for example piezoelectric ceramic) with spacers, which may be ceramic, glass, polymer, wood, or metal to separate the layers. Subsequently the stack is back filled with a filler to form a composite. The filler may be either a polarizable or non-polarizable material.

The stack is then cut to form slots and backfilled with a filler to form a further composite. Again, the filler may be polarizable or non-polarizable material and may be the same or a different filler material used in the previous step.

This innovative processing method forms a composite of 2—2 connectivity with no dicing. Further, forming a composite with 1–3 connectivity requires half the cuts of the traditional "dice and fill" method. Moreover, the present invention allows for the efficient manufacture of multiphasic composites.

A desired process of this invention for making a composite adapted for use in providing a piezoelectric composite, comprises the following steps:

a) forming a stack of a plurality of sheets selected from the group consisting of polarizable sheets and non-polarizable sheets, wherein spacers are used to provide said sheets in a spaced relationship and to provide unfilled spaces between said sheets;

b) filling the spaces separating said sheets with a filler material, said filler material having an acoustic impedance which is substantially different from the acoustic impedance of the material of said sheets; and c) removing said spacers provided said spacers have a composition with a substantially different impedance from the impedance of said filler material and provided that said spacers would substantially interfere with the functioning of said composites. The process can further comprise the following added steps:

d) cutting said composite in a direction transverse to said sheets to provide parallel slots and to the extent to leave an uncut portion of said composite to form a supporting base for the thereby formed parallel composite structures;

e) filling said slots with either said filler material or another material having an acoustic impedance which is substantially different from the acoustic impedance of both said filler material and said sheets; and f) removing said supporting base to provide a composite.

The invention disclosed herein allows any or all of the above mentioned composite designs, resulting in a high degree of flexibility in transducer design. The composite can be fine scale or multifunctional, with tailored properties within a single transducer.

BRIEF DESCRIPTION OF THE DRAWINGS

Comprehension of the invention is facilitated by reading the following detailed description in conjunction with the annexed drawings, in which:

FIGS. 1 to 4 illustrate the sequence of steps which are used in manufacturing a composite, while

FIG. 1 is a perspective drawing of a material in the form of tapes or sheets stacked and separated by spacers;

FIG. 2 is a perspective drawing of the stack, with 2—2 connectivity, after the filler material has been embedded and the spacers removed;

FIG. 3 is a perspective drawing of the embedded stack after dicing;

FIG. 4 is a perspective drawing of the diced stack after a filler material has been embedded and the base removed;

FIG. 5 is a perspective drawing showing a further embodiment according to the present invention in which a transducer contains multiple polarizable phases;

FIG. 6 is a perspective drawing showing a further embodiment according to the present invention in which the polarizable phase volume content across the device is varied by varying the thickness of the filler layer; and FIG. 7 is a perspective drawing showing a further embodiment according to the present invention in which polarizable phase volume content is varied across the device by varying the thickness of the tape or sheet.

DETAILED DESCRIPTION OF THE INVENTION

FIGS. 1 through 4 show the steps for manufacturing a composite ultrasound transducer constructed in accordance with the principles of the present invention.

Figure 1:
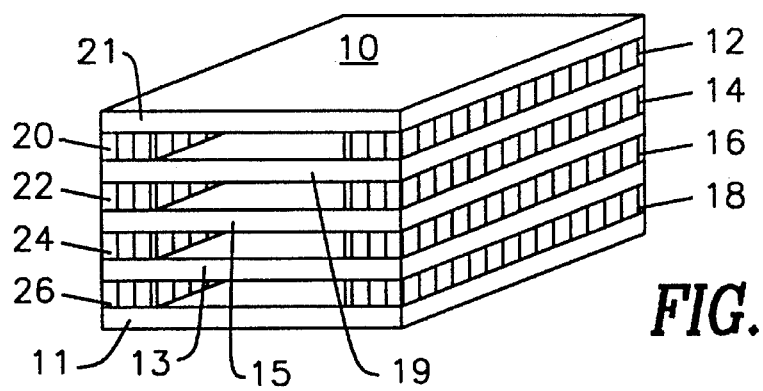

FIG. 1 is a stack 10 which is formed by laminating sheets or tapes 11, 13, 15, 19, and 21 with spacers 12, 14, 16, 18, 20, 22, 24, and 26. The sheets of material usually consist, for instance, of lead zirconate titanate $Pb(ZrTi)O_3$, lead metaniobate $Pb(Nb_2O_6)_1$, modified $PbTiO_3$ including $(Pb,Ca)TiO_3$ and $(Pb,Sm)TiO_3$, barium titanate $BaTiO_3$, PMN-PT $(1-x)Pb(Mg_{1/3}Nb_{2/3})O_3-xPbTiO_3$, PZN-PT/BT $Pb(Zn_{1/3}Nb_{2/3})O_3-PbTiO_3/BaTiO_3$, $Pb(Zn_{1/3} Nb_{2/3})O_3BaTiO_3-PbTiO_3$ or of another suitable transmitting, receiving, or sensing material. They may be formed by conventional tape casting, rolling, or extruding methods, or by cutting them from a block of solid material and lapping them to desired thickness. In this case, the number of sheets, of which only five are shown in the figure for simplification, is chosen to be equal to the desired number of active elements which are to be arranged in a row of the final transducer.

The spacers may consist of strips of a material and are arranged between the sheets or piezoelectric tapes. The spacers may be other shapes and/or configurations provided they are of sufficient size to create the desired space between the sheets. They may be of any effective thickness although usually between 5 and 5000 microns. The material used for the spacer may be polymer, ceramic, glass, metal, or wood. Preferably, a material is chosen that will not substantially interfere with the desired final properties of the piezoelectric composite because this will eliminate a step of removing the area of the composite containing the spacers.

Depending on the desired spacing between the sheets and the desired final properties of the composite, spacers with varying thicknesses may be employed in a single composite. The stack 10 of sheets and spacers are secured by a clamp (not shown) or alternatively, an adhesive material such as epoxy. The gaps between the sheets are filled with a polarizable or non-polarizable filler material by pouring, injection, or by immersion of the stack. The filler material may consist either of a non-polarizable material such as a self-hardening plastic, for example epoxy or silicone rubber or an polarizable material such as poly(vinylidene flouride) and copolymers thereof, polyvinylchloride, polyvinylflouride, or other polymer having suitable piezoelectric properties. Moreover, the filler may also be paper, glass, or ceramic.

Figure 2:
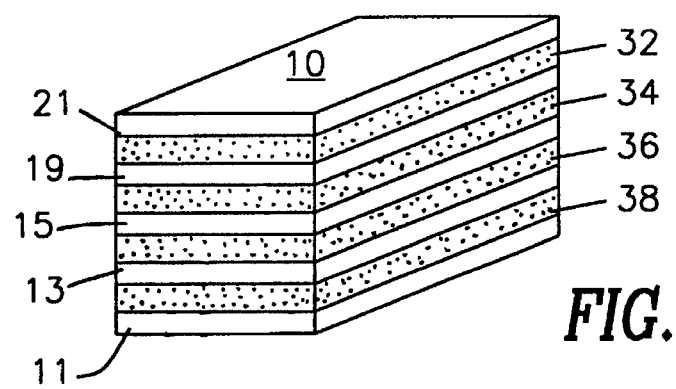

After the filler has filled in the gaps between the sheets, the regions of stack 10 containing only the sheets and spacer materials are trimmed or lapped away if the spacers have an acoustic impedance which is substantially different than the acoustic impedance of the filler material and would substantially interfere with the functioning of the composite. FIG. 2 shows stack 10 consisting of sheets 11, 13, 15, 19, and 21 with layers of filler material 32, 34, 36, and 38. At this point, the formation of a composite of 2—2 connectivity is completed. If a composite with 1–3 connectivity is desired, then manufacturing process is continued as described below.

Figure 3:
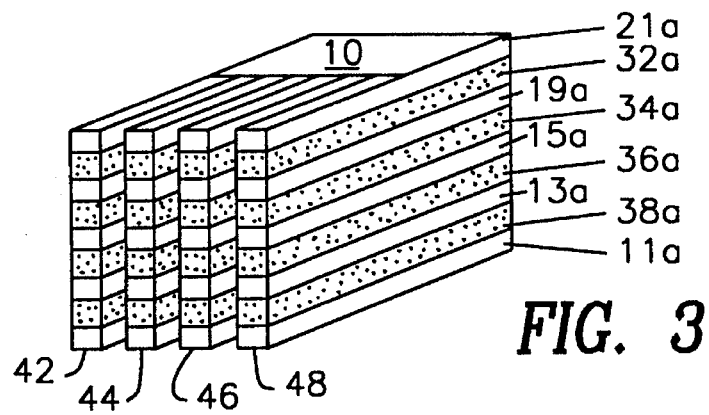

The stack is subsequently diced to form slots or trenches. FIG. 3 illustrates the results of a dicing if the stack is diced along planes which run orthogonally to the interfaces between the sheets and the filler.

Formed structures 42, 44, 46, and 48, consisting of remnants of sheets 11, 13, 15, 19, and 21, and filler material 32, 34, 36, and 38, remaining after completion of the dicing operation. The thickness and spacing of the dicing cuts depend upon the desired dimensions of and spacing between the active elements of the transducer produced by manufacturing method in accordance with this invention. Closer spacings allow higher frequency operation of the transducer. Dicing is not continuous through the stack, leaving the undiced section of stack 10 as a supporting base to keep stable structures 42, 44, 46, and 48.

Figure 4:
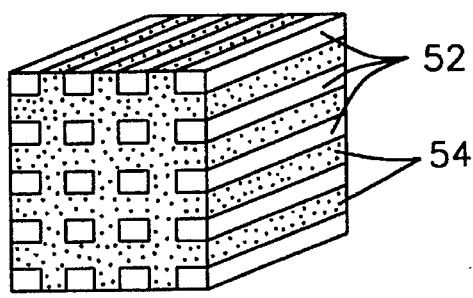

After dicing has been completed, diced stack 10 is refilled with a filler material by pouring, or by immersion of the stack and the supporting base section is trimmed or lapped away. The filler material may be the same filler material used in the earlier step in this process or it may be a completely different filler material. FIG. 4 shows an example of one possible final transducer, consisting of active material pillars 52, fully embedded in passive filler material 54. Although not illustrated, the composite would then be electroded with, for example, a silver paint on its end faces, and poled under an electric field.

Figure 5:
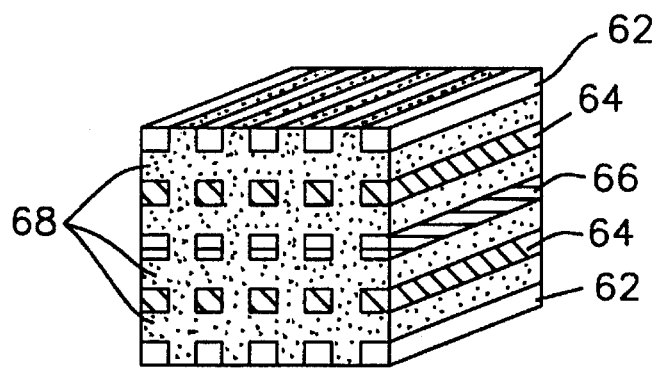
FIGS. 5, 6, and 7 are further embodiments made according to the present invention.

As a further embodiment of the present invention, a composite material may contain multiple polarizable phases. FIG. 5 is a perspective drawing showing such an embodiment. The figure shows polarizable phases 62, 64, and 66 embedded in non-polarizable filler material 68. The polarizable phases may be materials which act as transmitters, receivers, sensor, or actuators in the resulting transducer. The different polarizable phases are introduced into the composite during the manufacturing step illustrated in FIG. 1, where the sheets of polarizable material 11, 13, 15, 19, and 21 are varied in constructing laminated stack 10. Though the illustrated embodiment shows only three polarizable phases, the described invention method allows for an unlimited number of polarizable phases arranged on as fine a scale as layer by layer.

Figure 6:
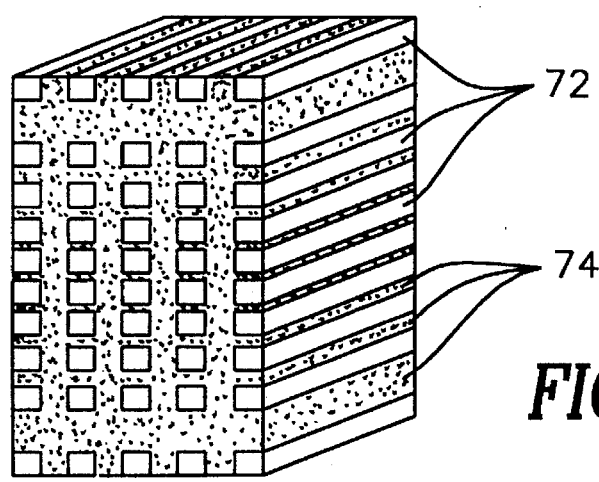

As yet a further embodiment of the present invention, a composite material may be formed in which the polarizable phase volume content across the device is varied. FIG. 6 is a perspective drawing showing such an embodiment. The figure shows polarizable phase 72 embedded in non-polarizable filler material 74. The variation in polarizable phase volume content across the device is introduced into the composite during the manufacturing step illustrated in FIG. 1, where the thickness of spacers 12, 14, 16, 18, 20, 22, 24, and 26 are varied in constructing laminated stack 10. The described invention method allows for an unlimited variation in volume content of polarizable phase across the device.

Figure 7:
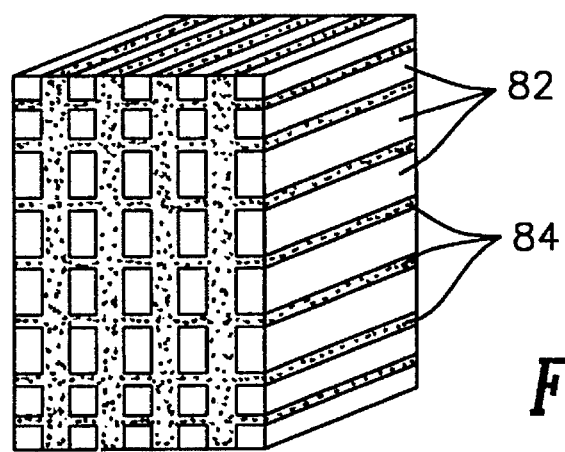

A further embodiment of the present invention in which the polarizable phase volume content across the device is varied is shown in FIG. 7. The figure shows a polarizable phase 82 embedded in a non-polarizable filler material 84. The variation in polarizable phase volume content across the device is introduced into the composite during the manufacturing step illustrated in FIG. 1, where the thickness of the sheets or tapes 11, 13, 15, 19, and 21, are varied in constructing the laminated stack 10. The described invention allows for an unlimited variation in volume content of polarizable phase across the device.

Although not illustrated, a further embodiment of the present invention is a composite material which both the number of polarizable materials and the polarizable phase volume content across the device is varied. Further, the arrangement of polarizable phases may be accomplished on as fine a scale (<50 microns) as prior art techniques allow.

Further embodiments, also not illustrated, include composites in which the sheets would consist of a non-polarizable phase(s) such as epoxy resin or a polarizable phase(s) such a polymer that is susceptible to polarization such as poly(vinylidene flouride) and its copolymers. The filler material may also either consist of an polarizable or non-polarizable composition allowing for a composite with both the sheets and the filler or fillers made from an polarizable materials.

The following examples will further illustrate the present invention.

EXAMPLE 1

A piezoelectric ceramic/polymer composite with a connectivity of 2—2 was formed using 1 cm long, 2 mm wide and 230-micron thick sheets of lead zirconate titanate Pb(Zr-Ti)O$_3$. The sheets were stacked, with 230-micron thick spacers separating the sheets. Non-reacted Spurrs epoxy (Spurrs 512, E. F. Fullum, Inc., Schenectady, N.Y.), was infiltrated into the spaces in the stack and cured. A 1–3 composite was formed by dicing the structure using a 250-μm thick saw blade on a Kulicke and Soffa Model 775-NPC Universal Dicing Saw (Horsham, Pa.). After dicing, the grooves were refilled with uncured Spurrs epoxy. After epoxy cure, the composite was electroded with silver paint, poled under an 25 KV/cm electric field at 75 degrees celsius for 15 minutes, and electromechanical properties were measured. Properties of composites are compared to those of standard lead zirconate titanate (PZT) on the Table I where $V_{PZT}$=Volume fraction of PZT (%); K=relative permittivity; $d_{33}$=longitudinal piezoelectric charge coefficient (picocoulomb/Newton); $g_h$=hydrostatic voltage coefficient (millivolt*meter/Newton; $d_h$=hydrostatic charge coefficient (picocoulomb/Newton); $d_h g_h$=hydrostatic figure of merit ($10^{-15}$m$^2$/Newton).

TABLE I

| MATERIAL | $V_{PZT}$ | K | $d_{33}$ | $g_h$ | $d_h$ | $d_h g_h$ |
|---|---|---|---|---|---|---|
| PZT | 100 | 1800 | 400 | 5 | 20 | 100 |
| 2-2 Composite | 50 | 300 | 370 | 10 | 30 | 300 |
| 1-3 Composite | 25 | 230 | 300 | 15 | 40 | 800 |

EXAMPLE 2

A multiple ceramic phase piezoelectric ceramic/polymer composite with a connectivity of 2—2 is formed using 100-micron thick sheets of lead metaniobate Pb(NbO$_3$)$_2$/ lead titanate PbTiO$_2$. The sheets are alternately stacked, with 50-micron thick spacers separating the sheets. Non-reacted Eccogel epoxy (Eccogel 1365-45, Emerson and Cumming, Deway and Almy Chemical Division, Canton, Mass.), is infiltrated into the stack and cured. A 1-3 composite is formed by dicing the structure using a 75 μm thick saw blade on the dicing saw. After dicing, the grooves are refilled with uncured Eccogel epoxy. After epoxy cure, the composite is electroded with silver paint, poled under an electric field, and electromechanical properties are measured.

EXAMPLE 3

A variable volume fraction ceramic phases piezoelectric ceramic/polymer composite with a connectivity of 2—2 is formed using 75, 125, and 230-micron thick sheets of lead zirconate titanate Pb(Zr,Ti)O$_3$. Sheet stacking sequence would be as follows: ten 75-micron, ten 125-micron, ten 230-micron, ten 125-micron, and ten 75-micron. The spacers separating all sheets are 125-micron thick. Non-reacted Eccogel epoxy is infiltrated into the stack and cured. A 1-3 composite is formed by dicing the structure using a 125 μm thick saw blade on a dicing saw. After dicing, the grooves are reflected with uncured Eccogel epoxy. After epoxy cure, the composite is electroded with silver paint, poled under an electric field, and electromechanical properties are measured.

The invention described herein has been disclosed in terms of specific embodiments and applications. However, these details are not meant to be limiting and other embodiments, in light of this teaching, would be obvious to persons skilled in the art. Accordingly, it is to be understood that the drawings and descriptions are illustrative of the principles of the invention, and should not be construed to limit the scope thereof.

What is claimed is:

1. A process for making a piezoelectric composite, comprising the following steps:

a) forming a stack of a plurality of polarizable sheets using spacers to provide said sheets in a spaced relationship and to provide unfilled spaces between said sheets;

b) filling the spaces separating said sheets with a filler material, said filler material having an acoustic impedance which is substantially different from the acoustic impedance of the material of said sheets;

c) cutting said composite in a direction transverse to said sheets to provide parallel slots and to the extent to leave an uncut portion of said composite to form a supporting base for the thereby formed parallel composite structures;

d) filling said slots with either said filler material or another material having an acoustic impedance which is substantially different from the acoustic impedance of both said filler material and said sheets; and e) removing said supporting base to provide a composite.

2. The process of claim 1 wherein the sheets are selected from the group consisting of Pb(ZrTi)O$_3$, Pb(NbO$_3$)$_2$, BaTiO$_3$, PbZrO$_3$, PbTiO$_3$, PbNb$_2$O$_6$, (Pb,Ca)TiO$_3$, (Pb,Sm)TiO$_3$, (1−x)Pb(Mg$_{1/3}$Nb$_{2/3}$)O$_3$—xPbTiO$_3$, Pb(Zn$_{1/3}$ Nb$_{2/3}$)O$_3$—PbTiO$_3$/BaTiO$_3$, Pb(Zn$_{1/3}$Nb$_{2/3}$)O$_3$BaTiO$_3$—PbTiO$_3$, or Pb(NbO$_2$)$_2$/PbTiO$_3$.

3. The process of claim 1 wherein the sheets used consist of at least two different compositions.

4. The process of claim 1 wherein the sheets are equispaced apart from one another.

5. The process of claim 1 wherein the sheets are unevenly spaced apart from one another.

6. The process of claim 1 wherein the sheets used within the composite are between 1 and 10,000 microns in thickness.

7. The process of claim 1 wherein the sheets used within the composite are between 1 and 100 microns in thickness.

8. The process of claim 1 wherein the spacers have a composition with an impedance which is substantially different from the impedance of the filler material and would not substantially interfere with the functioning of the composite.

9. The process of claim 1 wherein the spacers have a composition with an impedance which is not substantially different from the impedance of the filler material and would not substantially interfere with the functioning of the composite.

10. A process of claim 1 wherein the cutting step is accomplished utilizing any combination of mechanical abrasive sawing, laser ablation, ultrasonic cutting, electrodischarge machining and wet or dry etching.

11. The process of claim 1 wherein the filling material used in step (b) is substantially different from the material used in filling step (e).

12. The process of claim 1 wherein after step b and before step c, the spacers are removed.

* * * * *